(12) United States Patent
Zhan

(10) Patent No.: US 11,968,796 B2
(45) Date of Patent: Apr. 23, 2024

(54) CABLE MANAGEMENT BRACKET AND ELECTRONIC DEVICE

(71) Applicant: Wistron Corporation, New Taipei (TW)

(72) Inventor: Jun-Yu Zhan, New Taipei (TW)

(73) Assignee: Wistron Corporation, New Taipei (TW)

( * ) Notice: Subject to any disclaimer, the term of this patent is extended or adjusted under 35 U.S.C. 154(b) by 280 days.

(21) Appl. No.: 17/710,985

(22) Filed: Mar. 31, 2022

(65) Prior Publication Data
US 2023/0209762 A1  Jun. 29, 2023

(30) Foreign Application Priority Data

Dec. 27, 2021  (TW) .................................. 110148869

(51) Int. Cl.
*H05K 7/14* (2006.01)
*H05K 7/12* (2006.01)

(52) U.S. Cl.
CPC ............. *H05K 7/1491* (2013.01); *H05K 7/12* (2013.01)

(58) Field of Classification Search
CPC ...... H05K 7/1491; H05K 7/12; H05K 7/1447; H05K 5/0247; G06F 1/183
See application file for complete search history.

(56) References Cited

U.S. PATENT DOCUMENTS

| | | | | |
|---|---|---|---|---|
| 7,480,154 B2* | 1/2009 | Lawrence | ............ | H05K 7/1491 |
| | | | | 174/72 A |
| 7,988,110 B1* | 8/2011 | Liang | ....................... | H05K 7/12 |
| | | | | 248/62 |
| 8,157,222 B1* | 4/2012 | Shirey | ...................... | H02G 3/32 |
| | | | | 248/68.1 |
| 8,186,634 B2* | 5/2012 | Chen | .................... | H05K 7/1491 |
| | | | | 312/273 |
| 8,485,479 B2* | 7/2013 | Chiu | ....................... | H02G 3/32 |
| | | | | 248/68.1 |
| 8,674,217 B2* | 3/2014 | Huang | .................... | G06F 1/189 |
| | | | | 174/64 |
| 11,134,585 B2* | 9/2021 | LeGros | ............. | H05K 7/20854 |
| 11,276,995 B2* | 3/2022 | Chen | .................... | H02G 3/0456 |
| 11,626,717 B2* | 4/2023 | Gintz | .................. | H02G 3/0418 |
| | | | | 248/542 |

(Continued)

FOREIGN PATENT DOCUMENTS

TW  201324998  6/2013
TW  201724679  7/2017

*Primary Examiner* — Anthony Q Edwards
*Assistant Examiner* — Hung Q Dang
(74) *Attorney, Agent, or Firm* — Winston Hsu

(57) ABSTRACT

A cable management bracket includes a frame and a buckle member. The frame includes a first side portion and a second side portion, wherein the first side portion is opposite to the second side portion. The first side portion has a pivot hole, a first restraining portion and a second restraining portion, wherein the first restraining portion is located between the pivot hole and the second restraining portion. The second side portion has a first engaging portion. The buckle member includes a pivot portion and a second engaging portion. The pivot portion is inserted into the pivot hole and sandwiched in between the first restraining portion and the second restraining portion. The second engaging portion is rotatably engaged with the first engaging portion.

20 Claims, 11 Drawing Sheets

(56) References Cited

U.S. PATENT DOCUMENTS

| | | | | |
|---|---|---|---|---|
| 2012/0145837 A1* | 6/2012 | Li | ............................ | H02G 3/32 |
| | | | | 248/74.2 |
| 2012/0145838 A1* | 6/2012 | Chiu | ........................ | H02G 3/32 |
| | | | | 248/74.2 |
| 2012/0174349 A1* | 7/2012 | Fannon | .................... | H02G 3/32 |
| | | | | 24/457 |

* cited by examiner

CABLE MANAGEMENT BRACKET AND ELECTRONIC DEVICE

BACKGROUND OF THE INVENTION

1. Field of the Invention

The invention relates to a cable management bracket and an electronic device and, more particularly, to a cable management bracket capable of improving the space utilization above a circuit board and an electronic device equipped with the cable management bracket.

2. Description of the Prior Art

As technology advances and develops, various electronic devices (e.g. computer, server, etc.) are considered a necessity by a lot of people in their daily lives. In general, there are various electronic components disposed in the electronic device to provide various functions for the electronic device. Lots of electronic components are connected to a circuit board by cables. To avoid the cables being too cluttered, a cable management bracket is usually installed in the electronic device to fix and protect the cables. At present, the cable management bracket is integrally formed by plastic, such that the cable management bracket has a specific wall thickness. Thus, when a usable inside space of the cable management bracket is fixed, an overall height of the cable management bracket will increase to occupy large space above the circuit board.

SUMMARY OF THE INVENTION

The invention provides a cable management bracket capable of effectively improving the space utilization above a circuit board and an electronic device equipped with the cable management bracket, so as to solve the aforesaid problems.

According to an embodiment of the invention, a cable management bracket comprises a frame and a buckle member. The frame comprises a first side portion and a second side portion, wherein the first side portion is opposite to the second side portion. The first side portion has a pivot hole, a first restraining portion and a second restraining portion, wherein the first restraining portion is located between the pivot hole and the second restraining portion. The second side portion has a first engaging portion. The buckle member comprises a pivot portion and a second engaging portion. The pivot portion is inserted into the pivot hole and sandwiched in between the first restraining portion and the second restraining portion. The second engaging portion is rotatably engaged with the first engaging portion.

According to another embodiment of the invention, an electronic device comprises a casing and a cable management bracket. The cable management bracket is disposed in the casing. The cable management bracket comprises a frame and a buckle member. The frame comprises a first side portion and a second side portion, wherein the first side portion is opposite to the second side portion. The first side portion has a pivot hole, a first restraining portion and a second restraining portion, wherein the first restraining portion is located between the pivot hole and the second restraining portion. The second side portion has a first engaging portion. The buckle member comprises a pivot portion and a second engaging portion. The pivot portion is inserted into the pivot hole and sandwiched in between the first restraining portion and the second restraining portion. The second engaging portion is rotatably engaged with the first engaging portion.

As mentioned in the above, the cable management bracket of the invention essentially consists of the frame and the buckle member, wherein the buckle member is rotatably engaged with the frame, such that the buckle member can rotate to be opened or closed with respect to the frame. When a usable inside space of the cable management bracket is fixed, an overall height of the cable management bracket can be effectively reduced by means of the cooperation between the frame and the buckle member, so as to avoid occupying too much space above the circuit board. Accordingly, the space utilization above the circuit board can be effectively improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
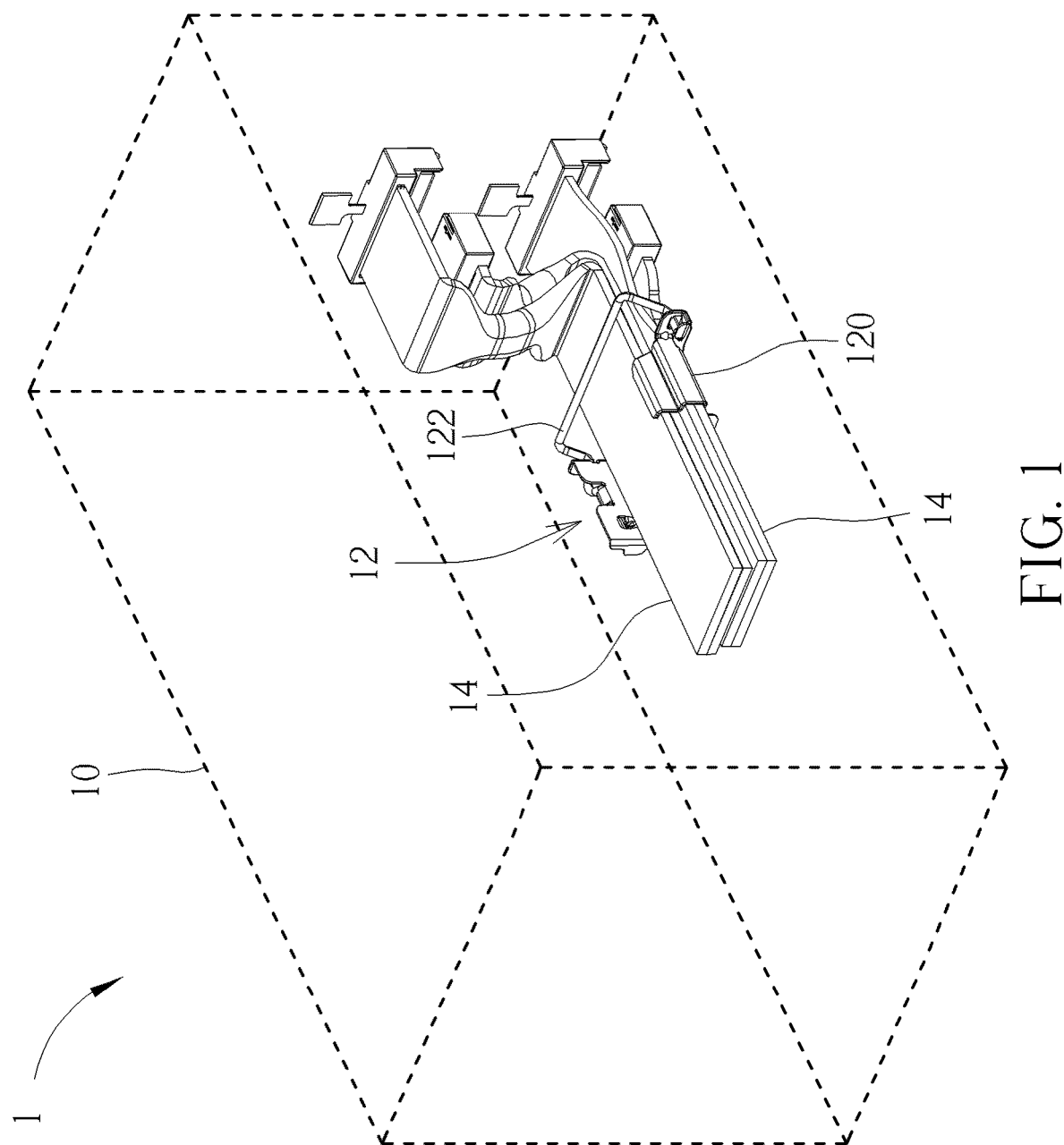
FIG. 1 is a perspective view illustrating an electronic device according to an embodiment of the invention.
Figure 2:
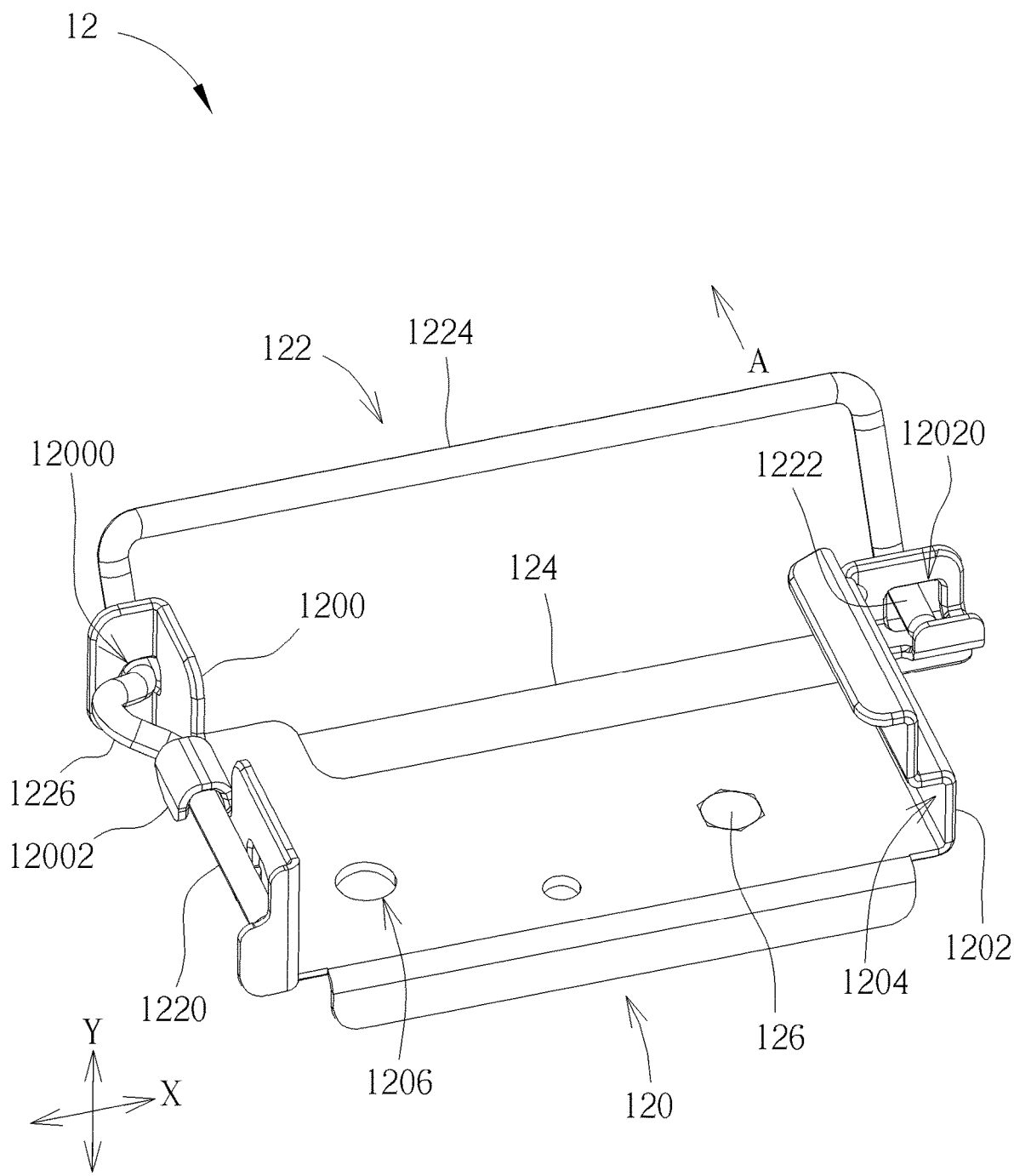
FIG. 2 is a perspective view illustrating a cable management bracket shown in FIG. 1.
Figure 3:
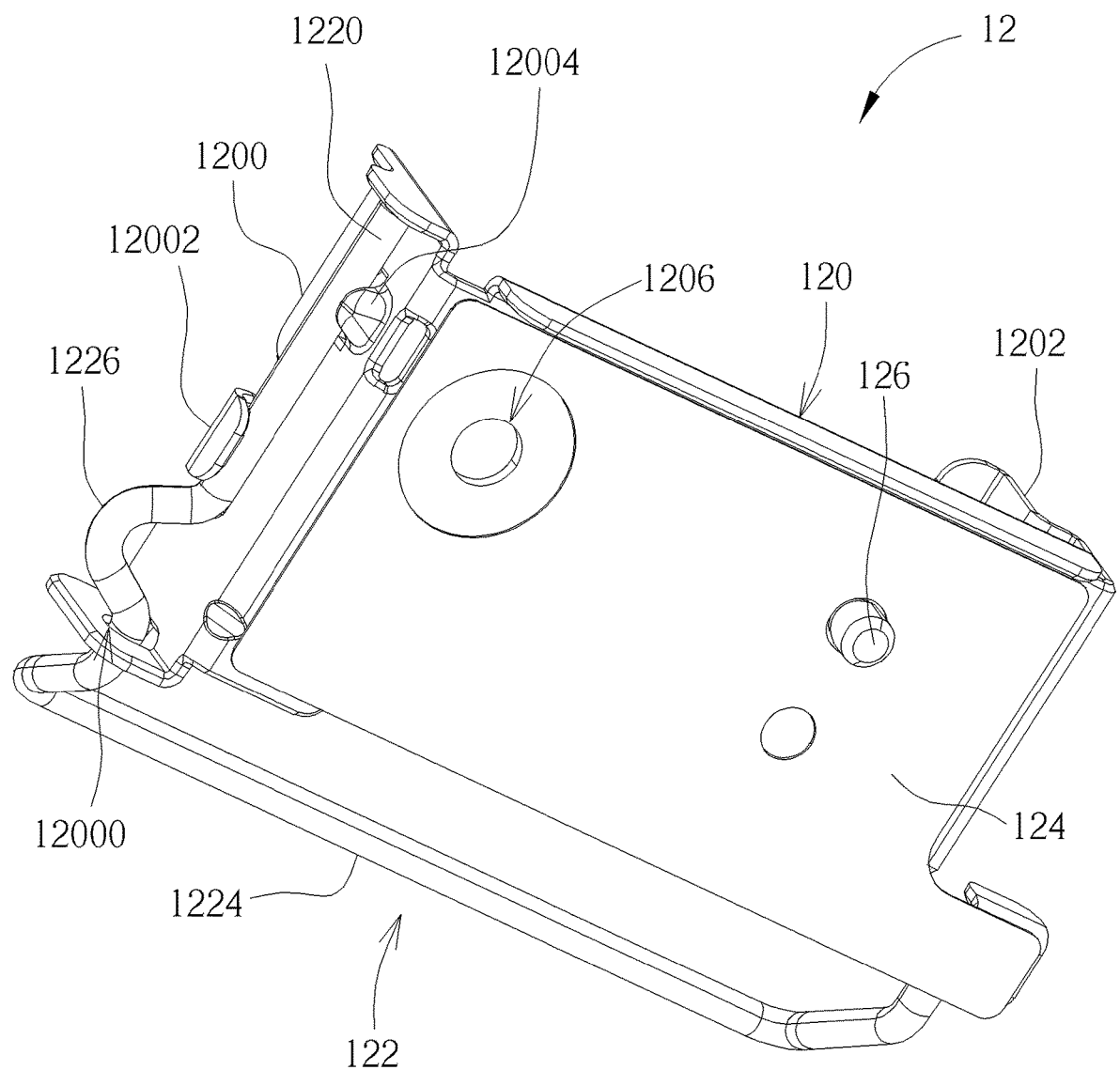
FIG. 3 is a perspective view illustrating the cable management bracket shown in FIG. 2 from another viewing angle.
Figure 4:
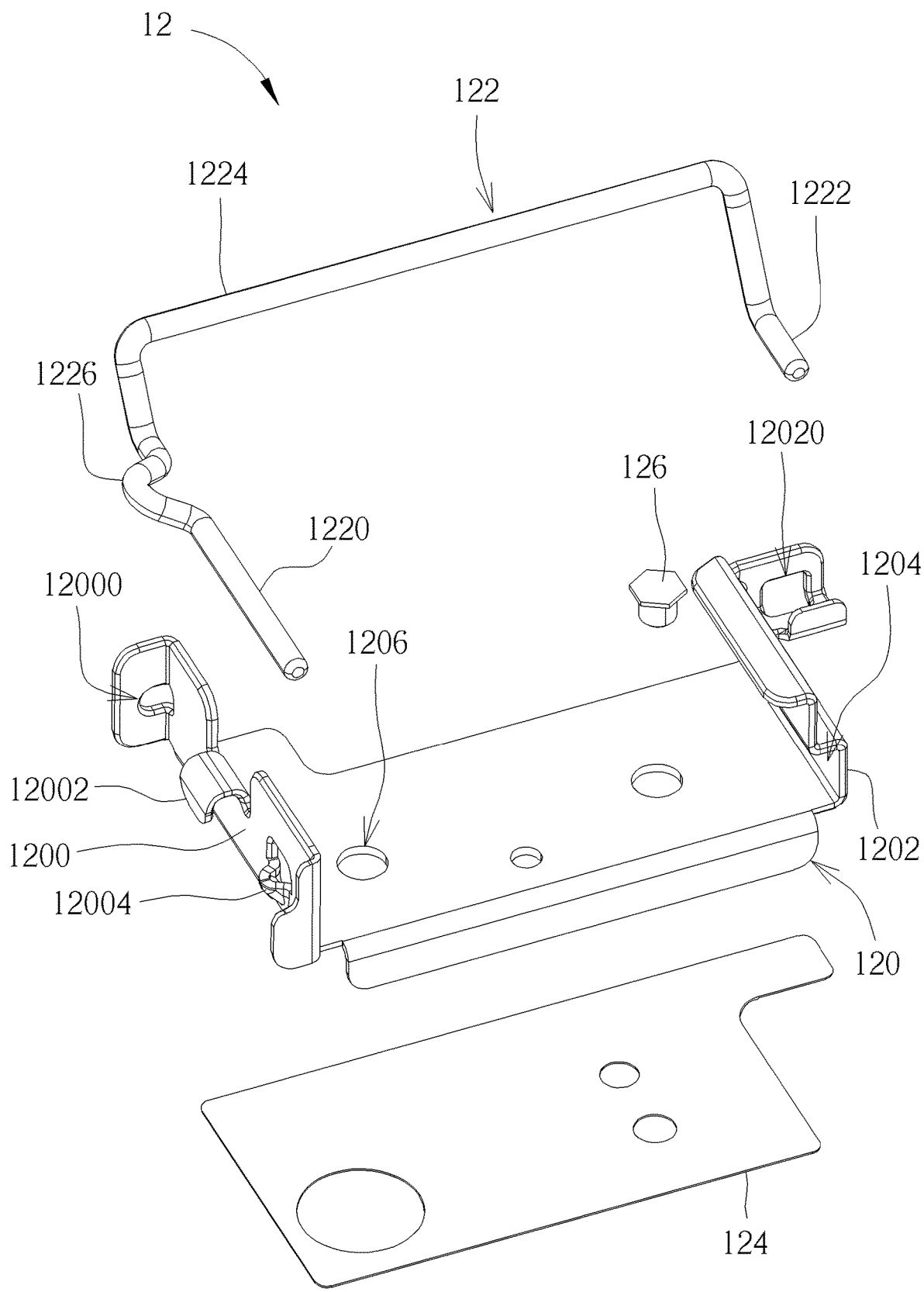
FIG. 4 is an exploded view illustrating the cable management bracket shown in FIG. 2.
Figure 5:
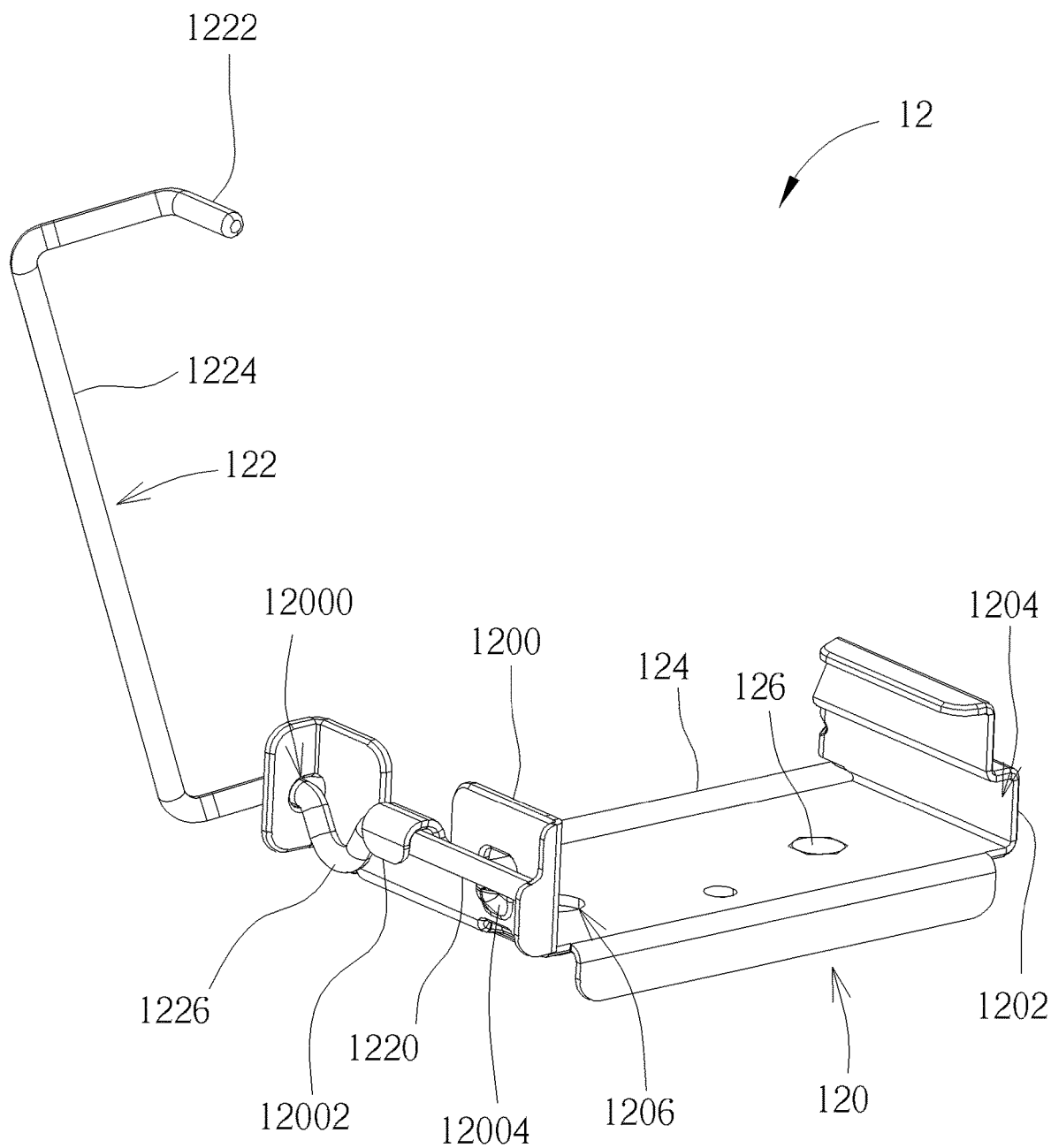
FIG. 5 is a perspective view illustrating a buckle member shown in FIG. 2 being opened with respect to a frame.

Referring to FIGS. 1 to 5, FIG. 1 is a perspective view illustrating an electronic device 1 according to an embodiment of the invention, FIG. 2 is a perspective view illustrating a cable management bracket 12 shown in FIG. 1, FIG. 3 is a perspective view illustrating the cable management bracket 12 shown in FIG. 2 from another viewing angle, FIG. 4 is an exploded view illustrating the cable management bracket 12 shown in FIG. 2, and FIG. 5 is a perspective view illustrating a buckle member 122 shown in FIG. 2 being opened with respect to a frame 120.

As shown in FIGS. 1 to 5, the electronic device 1 comprises a casing 10, a cable management bracket 12 and a plurality of layers of cables 14. The electronic device 1 may be a computer, a server, or other electronic devices equipped with the cable management bracket 12 and the cables 14 according to practical applications. In general, the electronic device 1 may be further equipped with some necessary hardware and/or software components for specific purposes, such as circuit board, processor, memory, power supply, applications, communication module, etc., and it depends on practical applications. Furthermore, the casing 10 shown in FIG. 1 is illustrated by dotted line and the appearance of the casing 10 may be designed according to practical applications. The cable management bracket 12 and the cables 14 are disposed in the casing 10. The cables 14 are configured to connect electronic components (not shown) to the circuit board (not shown), and the cable management bracket 12 is configured to fix and protect the cables 14. It should be noted that the number of the cables 14 may be determined according to practical applications, so the invention is not limited to the embodiment shown in the figure.

The cable management bracket 12 comprises a frame 120 and a buckle member 122. The frame 120 comprises a first side portion 1200 and a second side portion 1202, wherein the first side portion 1200 is opposite to the second side portion 1202. The first side portion 1200 having a pivot hole 12000, a first restraining portion 12002 and a second restraining portion 12004, wherein the first restraining portion 12002 is located between the pivot hole 12000 and the second restraining portion 12004. In this embodiment, the first restraining portion 12002 may be a U-shaped structure formed by bending the first side portion 1200, and the second restraining portion 12004 may be a platform protruding outward from the first side portion 1200. The second side portion 1202 has a first engaging portion 12020. In this embodiment, the first engaging portion 12020 may be an engaging hole.

The buckle member 122 comprises a pivot portion 1220, a second engaging portion 1222 and a grip portion 1224, wherein the pivot portion 1220 and the second engaging portion 1222 extend from opposite sides of the grip portion 1224 respectively. As shown in FIG. 2, the pivot portion 1220 is inserted into the pivot hole 12000 and sandwiched in between the first restraining portion 12002 and the second restraining portion 12004, so as to assemble the buckle member 122 to the frame 120. The first restraining portion 12002 and the second restraining portion 12004 cooperate with each other to restrain the pivot portion 1220 from moving in X and Y axes. The second engaging portion 1222 is rotatably engaged with the first engaging portion 12020, such that the buckle member 122 is closed with respect to the frame 120. Furthermore, a user may pull an end of the grip portion 1224 close to the second engaging portion 1222 toward a direction of an arrow A shown in FIG. 2 to disengage the second engaging portion 1222 from the first engaging portion 12020. When the second engaging portion 1222 is disengaged from the first engaging portion 12020, the buckle member 122 is able to rotate around the pivot portion 1220 to be opened with respect to the frame 120, as shown in FIG. 5.

In this embodiment, the pivot portion 1220 of the buckle member 122 may have a retaining structure 1226, wherein the retaining structure 1226 may be, but not limited to, an arc-shaped bending structure. As shown in FIG. 5, when the buckle member 122 rotates around the pivot portion 1220 to be opened with respect to the frame 120, the first side portion 1200 of the frame 120 will retain the retaining structure 1226 of the buckle member 122 to limit a maximum open angle of the buckle member 122. Accordingly, the invention can prevent nearby components from being damaged by the buckle member 122 due to too large open angle. In this embodiment, the maximum open angle of the buckle member 122 may be, but not limited to, 110 degrees. The maximum open angle of the buckle member 122 may be controlled by a bending angle of the retaining structure 1226.

In this embodiment, the second side portion 1202 of the frame 120 may be a stepped structure and has a plurality of recesses 1204, and the recesses 1204 are configured to accommodate a plurality of layers of cables 14. In this embodiment, the second side portion 1202 may have two recesses 1204 for accommodating two layers of cables 14, but the invention is not so limited. The number of the recesses 1204 of the second side portion 1202 may be determined according to the number of the cables 14. Furthermore, in this embodiment, each layer of cables 14 consists of two cables 14 stacked with each other, but the invention is not so limited. The number of the cables 14 in each layer may be determined according to practical applications.

When a user wants to use the cable management bracket 12 to fix the cables 14, the user may disengage the second engaging portion 1222 from the first engaging portion 12020 first and then rotate the buckle member 122 to open the buckle member 122 with respect to the frame 120. Then, the user may dispose the cables 14 into the recesses 1204 correspondingly and then rotate the buckle member 122 to engage the second engaging portion 1222 with the first engaging portion 12020. When the second engaging portion 1222 is engaged with the first engaging portion 12020, the buckle member 122 is closed with respect to the frame 120. At this time, the cables 14 are restrained on the frame 120 by the grip portion 1224 of the buckle member 122 and the recesses 1204 of the second side portion 1202, as shown in FIG. 1.

When a usable inside space of the cable management bracket 12 is fixed, an overall height of the cable management bracket 12 can be effectively reduced by means of the cooperation between the frame 120 and the buckle member 122, so as to avoid occupying too much space above the circuit board. Accordingly, the space utilization above the circuit board can be effectively improved. In this embodiment, the frame 120 may be made of sheet metal and the buckle member 122 may be formed by bending an iron wire. Accordingly, the wall thickness of the cable management bracket 12 can be reduced to further reduce the overall height of the cable management bracket 12. In another embodiment, the frame 120 and/or the buckle member 122 may also be made of plastic according to practical applications.

In this embodiment, the cable management bracket 12 may further comprise an isolation film 124 and a positioning member 126, wherein the isolation film 124 may be, but not limited to, a Mylar and the positioning member 126 may be, but not limited to, a rivet. The isolation film 124 is attached to a bottom of the frame 120 and the positioning member 126 is disposed on the frame 120. Furthermore, the frame 120 may have a through hole 1206. When the cable management bracket 12 is assembled to the circuit board, the positioning member 126 may be inserted into a positioning hole on the circuit board first. Then, the through hole 1206 is aligned with a screw hole on the circuit board and then a screw is fixed to the screw hole through the through hole 1206, so as to assemble the cable management bracket 12 to the circuit board. At this time, the isolation film 124 is located between the bottom of the frame 120 and the circuit board to provide isolation effect. In another embodiment, the positioning member may also be replaced by another through hole, such that the cable management bracket 12 may be fixed to two screw holes on the circuit board by two screws.

Figure 6:
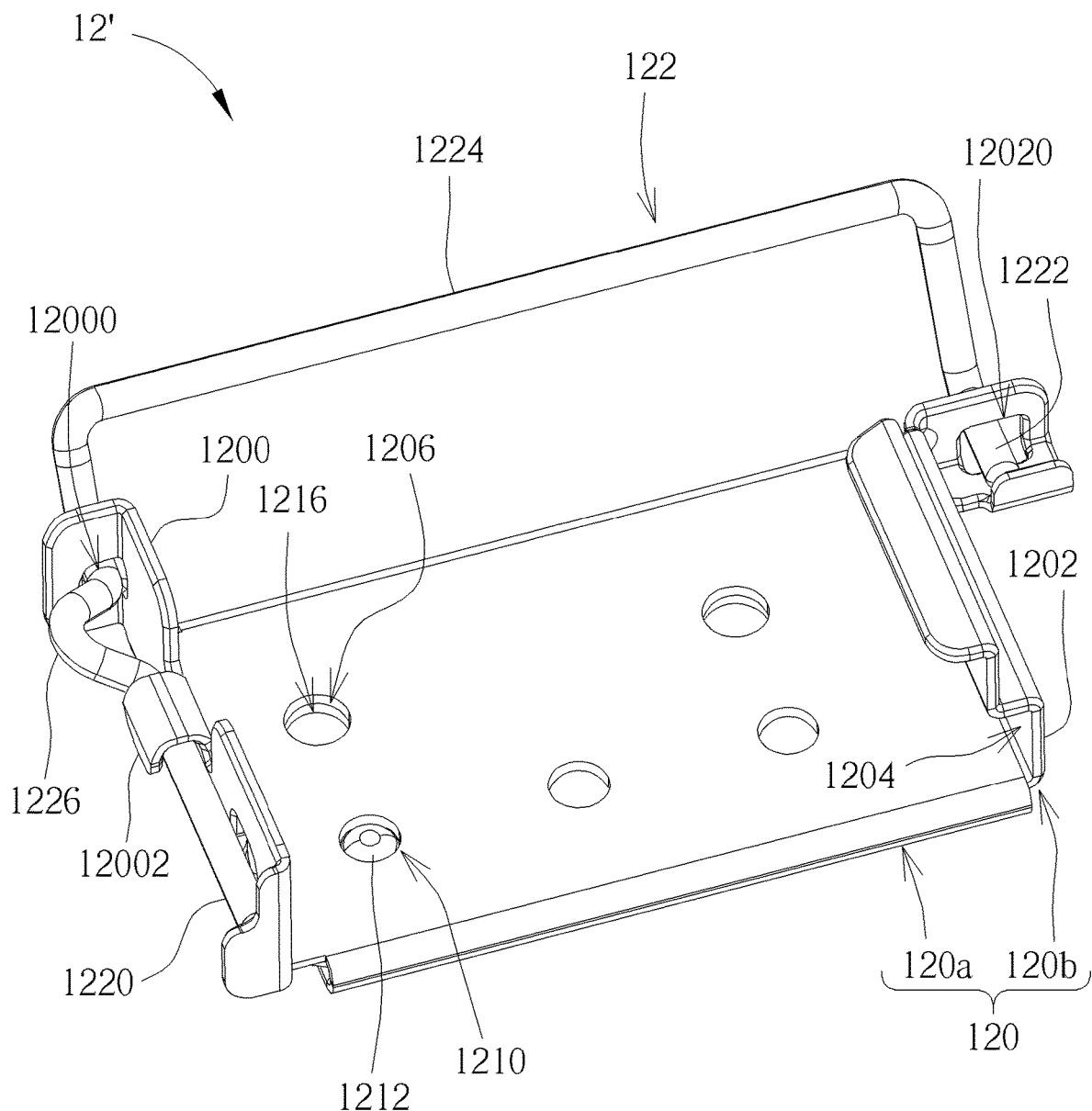
FIG. 6 is a perspective view illustrating a cable management bracket according to another embodiment of the invention.
Figure 7:
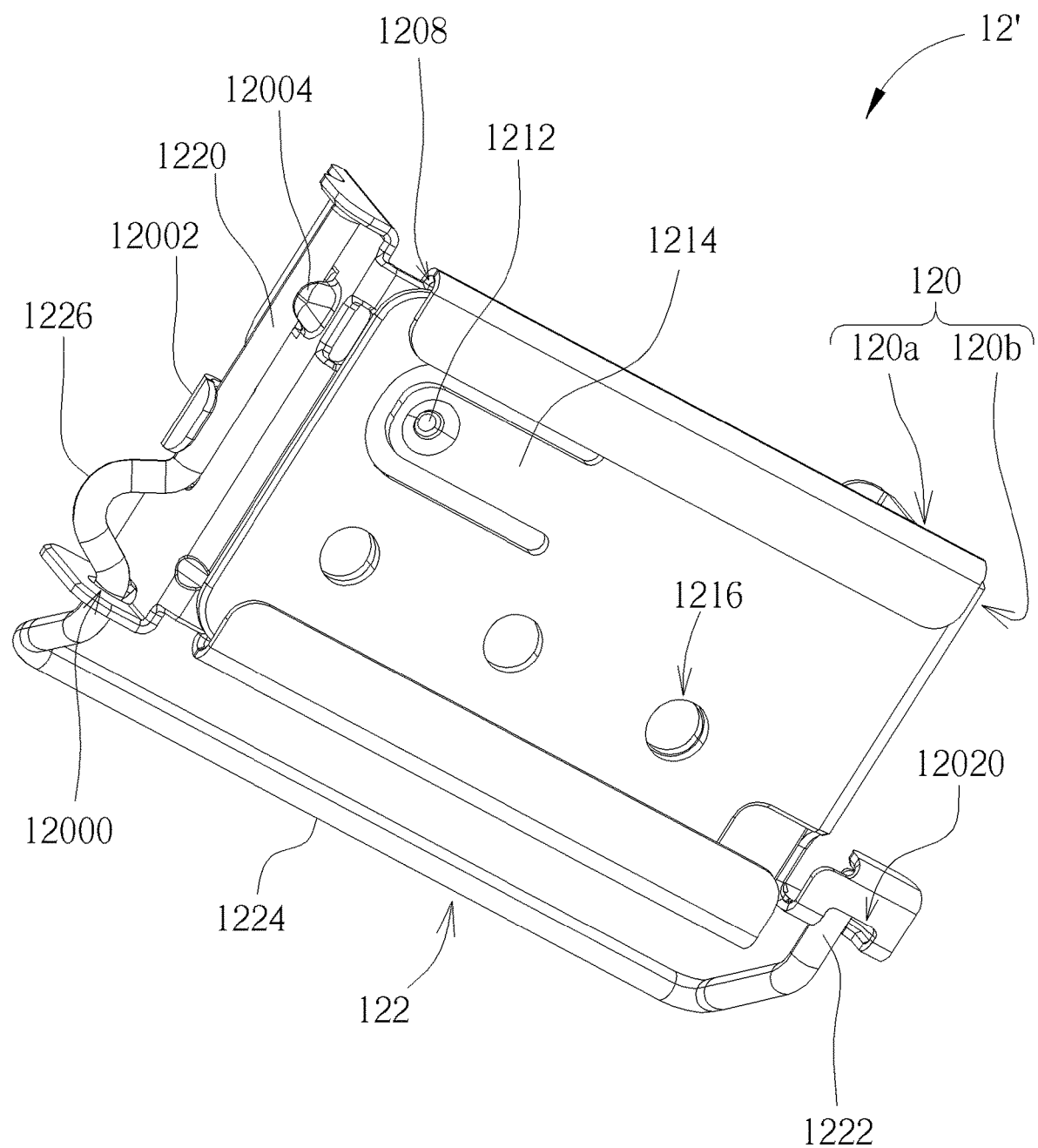
FIG. 7 is a perspective view illustrating the cable management bracket shown in FIG. 6 from another viewing angle.
Figure 8:
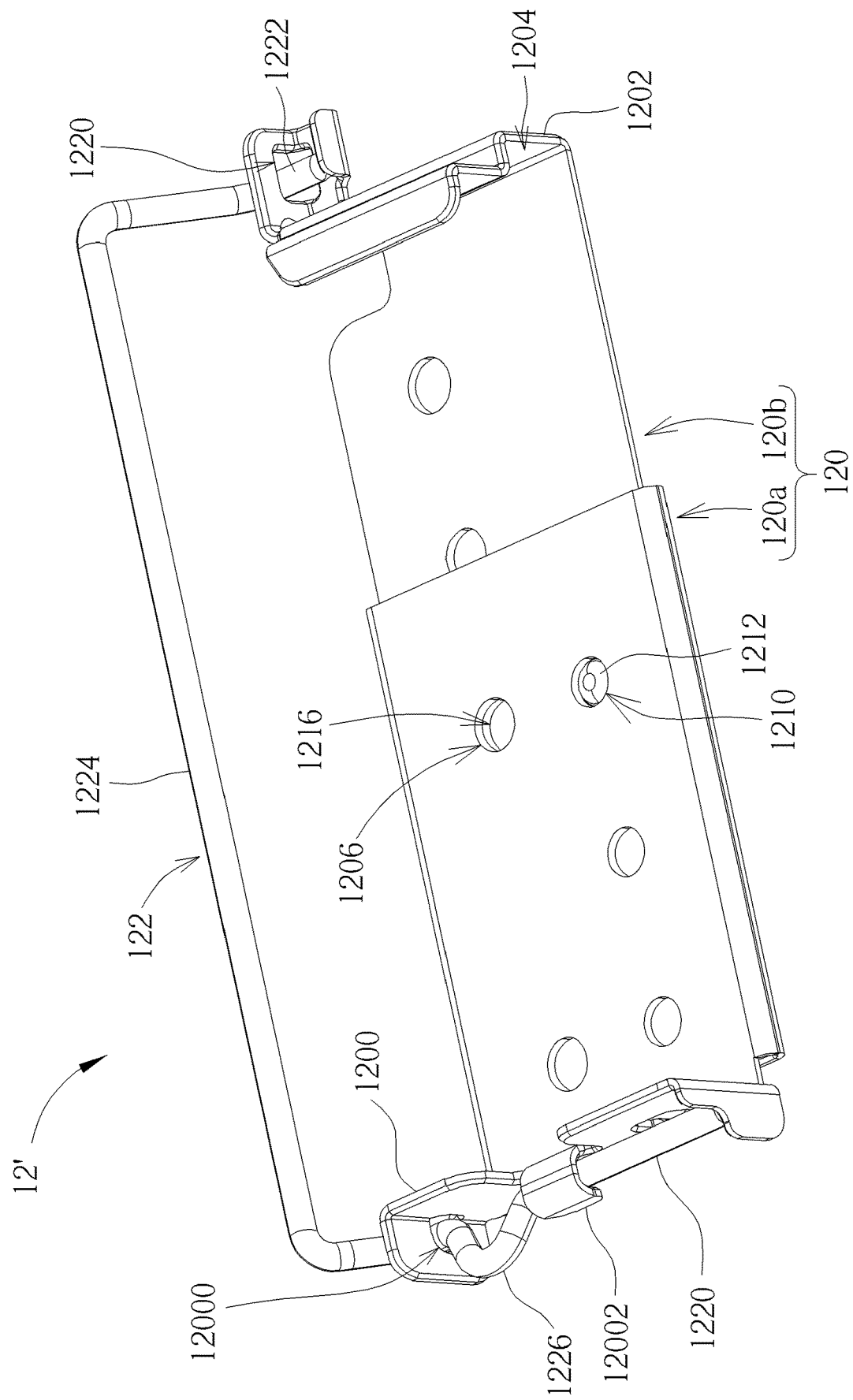
FIG. 8 is a perspective view illustrating a length of the frame shown in FIG. 6 being adjusted.

Referring to FIGS. 6 to 8, FIG. 6 is a perspective view illustrating a cable management bracket 12' according to another embodiment of the invention, FIG. 7 is a perspective view illustrating the cable management bracket 12' shown in FIG. 6 from another viewing angle, and FIG. 8 is a perspective view illustrating a length of the frame 120 shown in FIG. 6 being adjusted.

The cable management bracket 12' shown in FIG. 6 may be disposed in the casing 10 of the electronic device 1 to replace the cable management bracket 12 shown in FIG. 1. The main difference between the cable management bracket 12' and the aforesaid cable management bracket 12 is that the frame 120 of the cable management bracket 12' comprises a first plate member 120a and a second plate member 120b, wherein the first side portion 1200 is located on the first plate member 120a and the second side portion 1202 is located on the second plate member 120b, as shown in FIGS. 6 to 8. It should be noted that the same elements in FIGS. 6-8 and FIGS. 1-5 are represented by the same numerals, so the repeated explanation will not be depicted herein again.

In this embodiment, the first plate member 120a has a sliding groove 1208 and a plurality of positioning holes 1210, wherein the sliding groove 1208 may be formed by bending opposite sides of the first plate member 120a downward, as shown in FIG. 7. Furthermore, the second plate member 120b has a positioning portion 1212 and an elastic arm 1214, wherein the positioning portion 1212 is located on the elastic arm 1214, as shown in FIG. 7. The second plate member 120b is slidably disposed in the sliding groove 1208, such that the second plate member 120b can slide with respect to the first plate member 120a to adjust a length of the frame 120. Still further, the positioning portion 1212 of the second plate member 120b may be engaged with one of the positioning holes 1210 of the first plate member 120a to fix the length of the frame 120. In this embodiment, the first plate member 120a has three positioning holes 1210. Thus, the frame 120 may be adjusted to one of three lengths according to the required size of inside space. It should be noted that the number of the positioning holes 1210 of the first plate member 120a may be determined according to practical applications, so the invention is not limited to the embodiment shown in the figures. Since the length of the frame 120 may be adjusted according to the required size of inside space, the invention is more flexible in use.

When the second plate member 120b slides with respect to the first plate member 120a, the positioning portion 1212 may be easily engaged with or disengaged from the positioning hole 1210 by means of elastic deformation of the elastic arm 1214. In this embodiment, the length of the buckle member 122 cannot be adjusted. Thus, the invention may provide three buckle members 122 corresponding to three lengths of the frame 120. The user may detach the buckle member 122 from the frame 12 first and then slide the second plate member 120b with respect to the first plate member 120a to adjust the length of the frame 120. After adjusting the length of the frame 120, the user assembles another buckle member 122 corresponding to the length of the frame 120 to the frame 120.

In this embodiment, the first plate member 120a may have two through holes 1206 and the second plate member 120b may have three through holes 1216. After adjusting the length of the frame 120, at least one of the two through holes 1206 of the first plate member 120a is aligned with at least one of the three through holes 1216 of the second plate member 120b. Thus, the user may fix screws to the corresponding screw holes on the circuit board through the through hole 1206 and/or the through hole 1216 to assemble the cable management bracket 12' to the circuit board.

Figure 9:
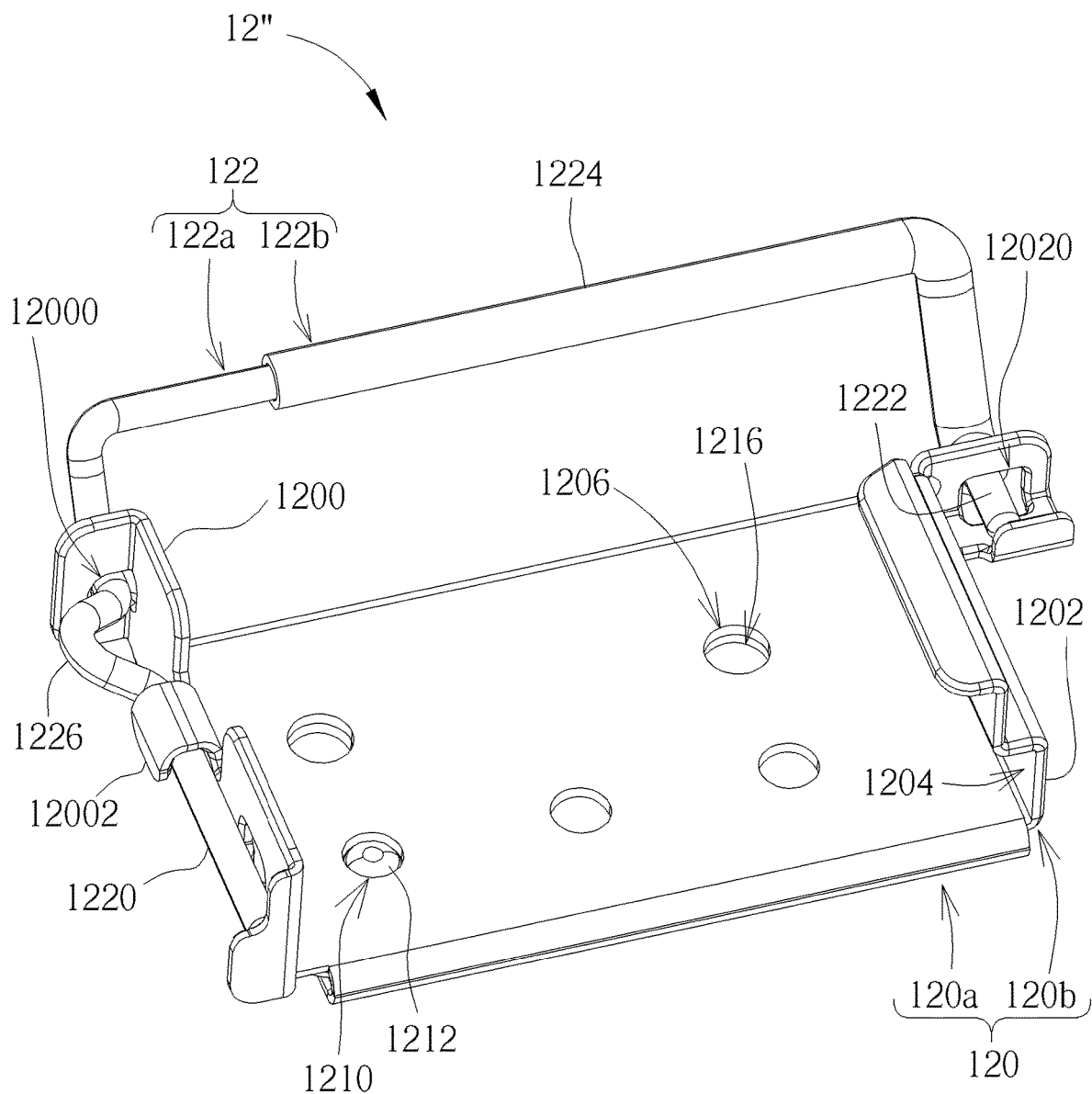
FIG. 9 is a perspective view illustrating a cable management bracket according to another embodiment of the invention.
Figure 10:
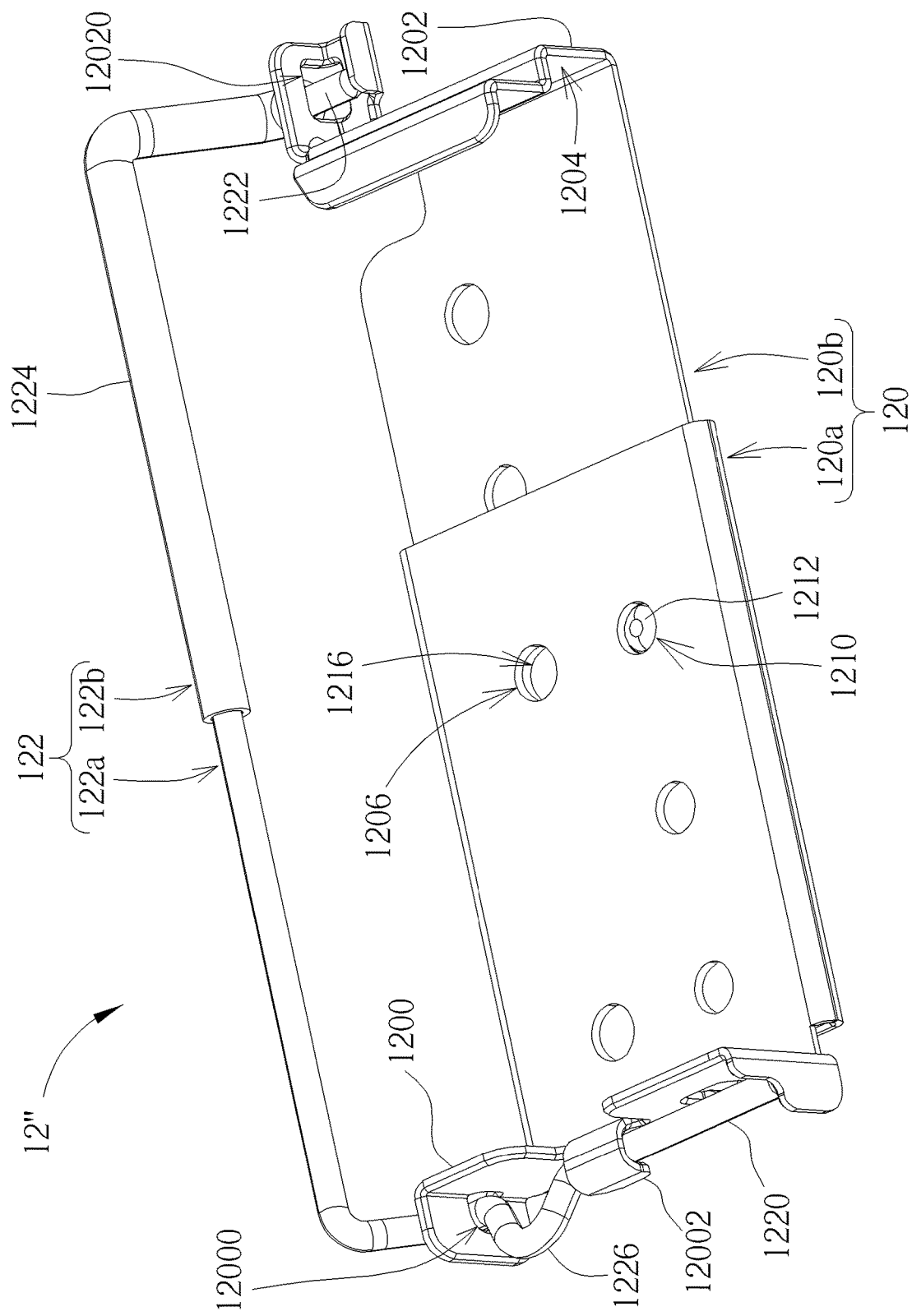
FIG. 10 is a perspective illustrating the lengths of the frame and the buckle member shown in FIG. 9 being adjusted.
Figure 11:
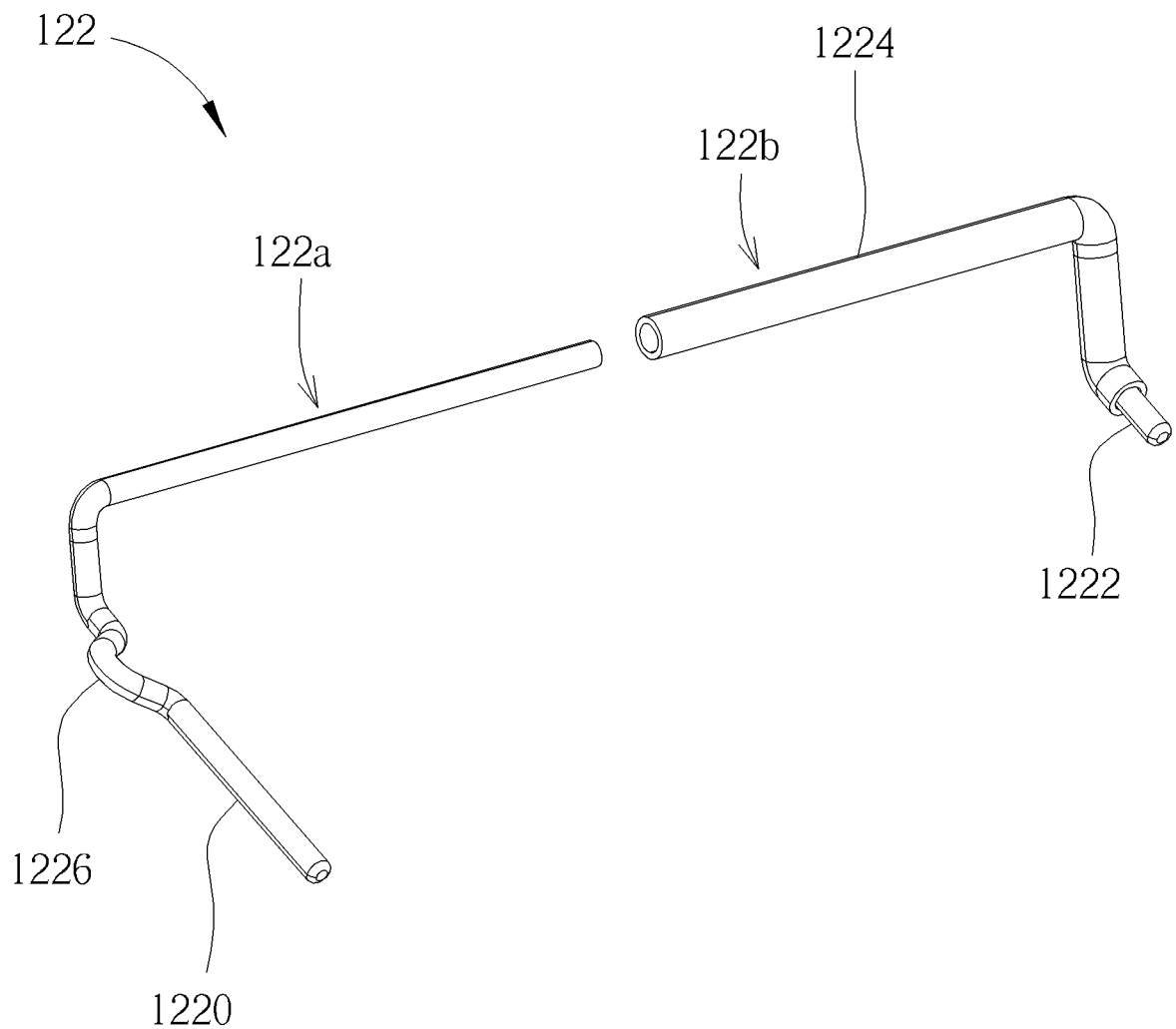
FIG. 11 is an exploded view illustrating the buckle member shown in FIG. 9.

Referring to FIGS. 9 to 11, FIG. 9 is a perspective view illustrating a cable management bracket 12" according to another embodiment of the invention, FIG. 10 is a perspective illustrating the lengths of the frame 120 and the buckle member 122 shown in FIG. 9 being adjusted, and FIG. 11 is an exploded view illustrating the buckle member 122 shown in FIG. 9.

The cable management bracket 12" shown in FIG. 9 may be disposed in the casing 10 of the electronic device 1 to replace the cable management bracket 12 shown in FIG. 1. The main difference between the cable management bracket 12" and the aforesaid cable management bracket 12' is that the buckle member 122 of the cable management bracket 12" comprises a rod 122a and a tube 122b, wherein the pivot portion 1220 is located on the rod 122a and the second engaging portion 1222 is located on the tube 122b, as shown in FIGS. 9 to 11. It should be noted that the same elements in FIGS. 9-11 and FIGS. 1-8 are represented by the same numerals, so the repeated explanation will not be depicted herein again.

In this embodiment, the rod 122a is slidably inserted into the tube 122b, such that the tube 122b is able to slide with respect to the rod 122a to adjust the length of the buckle member 122. Accordingly, when the second plate member 120b slides with respect to the first plate member 120a to adjust the length of the frame 120, the tube 122b can also slide with respect to the rod 122a to adjust the length of the buckle member 122 corresponding to the length of the frame 120. In other words, the lengths of the frame 120 and the buckle member 122 may be adjusted synchronously according to the required size of inside space, such that the invention is more convenient in use.

As mentioned in the above, the cable management bracket of the invention essentially consists of the frame and the buckle member, wherein the buckle member is rotatably engaged with the frame, such that the buckle member can rotate to be opened or closed with respect to the frame. When a usable inside space of the cable management bracket is fixed, an overall height of the cable management bracket can be effectively reduced by means of the cooperation between the frame and the buckle member, so as to avoid occupying too much space above the circuit board. Accordingly, the space utilization above the circuit board can be effectively improved. In an embodiment, the frame may be made of sheet metal and the buckle member may be formed by bending an iron wire. Accordingly, the wall thickness of the cable management bracket can be reduced to further reduce the overall height of the cable management bracket. In another embodiment, the length of the frame may be adjusted according to the required size of inside space, such that the invention is more flexible in use. In another embodiment, the lengths of the frame and the buckle member may be adjusted synchronously according to the required size of inside space, such that the invention is more convenient in use.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cable management bracket comprising:
a frame comprising a first side portion and a second side portion, the first side portion being opposite to the second side portion, the first side portion having a pivot hole, a first restraining portion and a second restraining portion, the first restraining portion being located between the pivot hole and the second restraining portion, the second side portion having a first engaging portion; and
a buckle member comprising a pivot portion and a second engaging portion, the pivot portion being inserted into the pivot hole and sandwiched in between the first restraining portion and the second restraining portion, the second engaging portion being rotatably engaged with the first engaging portion.

2. The cable management bracket of claim 1, wherein when the second engaging portion is engaged with the first engaging portion, the buckle member is closed with respect to the frame; when the second engaging portion is disengaged from the first engaging portion, the buckle member is able to rotate around the pivot portion to be opened with respect to the frame.

3. The cable management bracket of claim 1, wherein the pivot portion has a retaining structure and the first side portion retains the retaining structure to limit a maximum open angle of the buckle member.

4. The cable management bracket of claim 1, wherein the second side portion is a stepped structure and has a plurality of recesses, and the recesses are configured to accommodate a plurality of layers of cables.

5. The cable management bracket of claim 1, wherein the first restraining portion is a U-shaped structure.

6. The cable management bracket of claim 1, further comprising an isolation film attached to a bottom of the frame.

7. The cable management bracket of claim 1, further comprising a positioning member disposed on the frame.

8. The cable management bracket of claim 1, wherein the frame comprises a first plate member and a second plate member, the first side portion is located on the first plate member, the second side portion is located on the second plate member, the first plate member has a sliding groove and a plurality of positioning holes, the second plate member has a positioning portion, the second plate member is slidably disposed in the sliding groove, and the positioning portion is engaged with one of the positioning holes.

9. The cable management bracket of claim 8, wherein the second plate member has an elastic arm and the positioning portion is located on elastic arm.

10. The cable management bracket of claim 8, wherein the buckle member comprises a rod and a tube, the pivot portion is located on the rod, the second engaging portion is located on the tube, the rod is slidably inserted into the tube; when the second plate member slides with respect to the first plate member to adjust a length of the frame, the tube slides with respect to the rod to adjust a length of the buckle member corresponding to the length of the frame.

11. An electronic device comprising:
a casing; and
a cable management bracket disposed in the casing, the cable management bracket comprising:
a frame comprising a first side portion and a second side portion, the first side portion being opposite to the second side portion, the first side portion having a pivot hole, a first restraining portion and a second restraining portion, the first restraining portion being located between the pivot hole and the second restraining portion, the second side portion having a first engaging portion; and
a buckle member comprising a pivot portion and a second engaging portion, the pivot portion being inserted into the pivot hole and sandwiched in between the first restraining portion and the second restraining portion, the second engaging portion being rotatably engaged with the first engaging portion.

12. The electronic device of claim 11, wherein when the second engaging portion is engaged with the first engaging portion, the buckle member is closed with respect to the frame; when the second engaging portion is disengaged from the first engaging portion, the buckle member is able to rotate around the pivot portion to be opened with respect to the frame.

13. The electronic device of claim 11, wherein the pivot portion has a retaining structure and the first side portion retains the retaining structure to limit a maximum open angle of the buckle member.

14. The electronic device of claim 11, further comprising a plurality of layers of cables, the second side portion being a stepped structure and having a plurality of recesses, the recesses being configured to accommodate the layers of cables.

15. The electronic device of claim 11, wherein the first restraining portion is a U-shaped structure.

16. The electronic device of claim 11, wherein the cable management bracket further comprises an isolation film attached to a bottom of the frame.

17. The electronic device of claim 11, wherein the cable management bracket further comprises a positioning member disposed on the frame.

18. The electronic device of claim 11, wherein the frame comprises a first plate member and a second plate member, the first side portion is located on the first plate member, the second side portion is located on the second plate member, the first plate member has a sliding groove and a plurality of positioning holes, the second plate member has a positioning portion, the second plate member is slidably disposed in the sliding groove, and the positioning portion is engaged with one of the positioning holes.

19. The electronic device of claim 18, wherein the second plate member has an elastic arm and the positioning portion is located on elastic arm.

20. The electronic device of claim 18, wherein the buckle member comprises a rod and a tube, the pivot portion is located on the rod, the second engaging portion is located on the tube, the rod is slidably inserted into the tube; when the second plate member slides with respect to the first plate member to adjust a length of the frame, the tube slides with respect to the rod to adjust a length of the buckle member corresponding to the length of the frame.

* * * * *